United States Patent
Kao et al.

(10) Patent No.: US 9,538,652 B2
(45) Date of Patent: Jan. 3, 2017

(54) ELECTRICAL PLUG CONNECTOR ASSEMBLY

(71) Applicant: Advanced-Connectek Inc., New Taipei (TW)

(72) Inventors: Ya-Fen Kao, New Taipei (TW);
Yu-Lun Tsai, New Taipei (TW);
Pin-Yuan Hou, New Taipei (TW);
Chung-Fu Liao, New Taipei (TW);
Yang-Yang Zhou, New Taipei (TW)

(73) Assignee: Advanced-Connectek Inc., New Taipei (TW)

( * ) Notice: Subject to any disclaimer, the term of this patent is extended or adjusted under 35 U.S.C. 154(b) by 0 days.

(21) Appl. No.: 14/946,807

(22) Filed: Nov. 20, 2015

(65) Prior Publication Data

US 2016/0156114 A1    Jun. 2, 2016

(30) Foreign Application Priority Data

Nov. 27, 2014   (CN) .......................... 2014 1 1695648

(51) Int. Cl.
| | |
|---|---|
| *H01R 12/00* | (2006.01) |
| *H05K 1/00* | (2006.01) |
| *H05K 1/11* | (2006.01) |
| *H01R 12/72* | (2011.01) |
| *H01R 24/60* | (2011.01) |

(52) U.S. Cl.
CPC ............. *H05K 1/111* (2013.01); *H01R 12/724* (2013.01); *H01R 12/725* (2013.01); *H01R 24/60* (2013.01)

(58) Field of Classification Search
CPC ..... H01R 12/57; H01R 12/725; H01R 12/724; H01R 24/60; H05K 1/111; H05K 1/11
USPC .................................................... 439/83, 660
See application file for complete search history.

(56) References Cited

U.S. PATENT DOCUMENTS 9,281,582 B2 *   3/2016  Hou ..................... H01R 12/707
                                                                439/626

* cited by examiner

*Primary Examiner* — Javaid Nasri
(74) *Attorney, Agent, or Firm* — patenttm.us (57) ABSTRACT

An electrical plug connector assembly has an insulative housing, a first terminal set, a second terminal set and a circuit board. The first and second terminal sets are mounted in the insulative housing. The first terminal set has multiple first conductive terminals each including a first soldering section. The second terminal set has multiple second conductive terminals each including a second soldering section. The first and second soldering sections are soldered on an identical surface of the circuit board such that only one single soldering process is required to solder all of the first and second conductive terminals to the circuit board. The production rate of the electrical plug connector assembly is therefore improved.

14 Claims, 11 Drawing Sheets

ELECTRICAL PLUG CONNECTOR ASSEMBLY

BACKGROUND OF THE INVENTION

1. Field of the Invention

The present invention relates to an electrical connector, and more particularly to an electrical plug connector assembly that solders two sets of soldering sections of terminals on a single surface of a circuit board to decrease the soldering processes, which increases the fabrication rate of the electrical plug connector.

2. Description of Related Art

Electrical connectors are common electrical components mounted on electronic devices and may be connected to corresponding electrical connectors on other electronic devices for signal transmission or power supply between the connected electronic devices.

A conventional electrical connector such as a universal serial bus (USB) 3.0 Type-C electrical plug connector has an insulative housing, two sets of terminals, a circuit board and a metal shell. The sets of the terminals are mounted on the insulative housing for signal transmission and each terminal of each set has a soldering section. The circuit board is mounted on a rear end of the insulative housing and has two sets of soldering portions corresponding to the sets of the terminals and respectively mounted on two opposite top and bottom surfaces of the circuit board. Each soldering portion is soldered to the soldering section of a corresponding terminal. The shell covers and accommodates the insulative housing and the terminals.

However, because the two sets of the soldering sections of the terminals are respectively mounted on the top surface and the bottom surface of the circuit board instead of being mounted on a single surface, at least two soldering processes must be implemented to connect the sets of the terminals on the circuit board. Therefore, the soldering processes waste time and lower the production rate of the electrical connector.

To overcome the shortcomings, the present invention provides an electrical plug connector assembly to mitigate or obviate the aforementioned problems.

SUMMARY OF THE INVENTION

The main objective of the invention is to provide an electrical plug connector assembly that solders two sets of soldering sections of terminals on a single surface of a circuit board to decrease the soldering processes, which increases the fabrication rate of the electrical plug connector.

An electrical plug connector assembly in accordance with present invention comprises an insulative housing, a first terminal set, a second terminal set and a circuit board. The first and second terminal sets are mounted in the insulative housing. The first terminal set has multiple first conductive terminals each including a first soldering section. The second terminal set has multiple second conductive terminals each including a second soldering section. The first and second soldering sections are soldered on an identical surface of the circuit board such that only one single soldering process is required to solder all of the first and second conductive terminals to the circuit board. The production rate of the electrical plug connector assembly is therefore improved.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
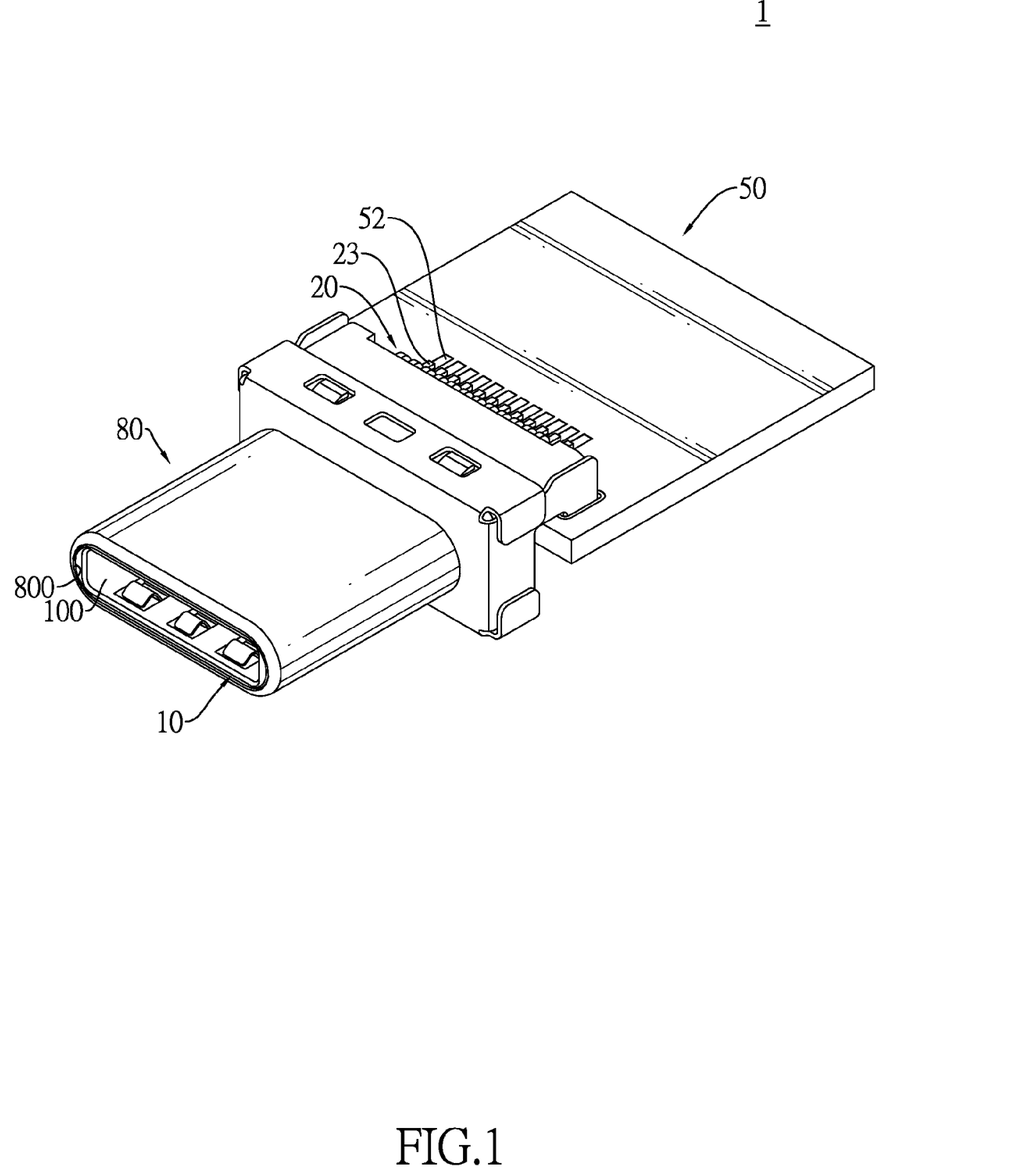
FIG. 1 is a perspective view of a first embodiment of an electrical plug connector assembly in accordance with the present invention.
Figure 2:
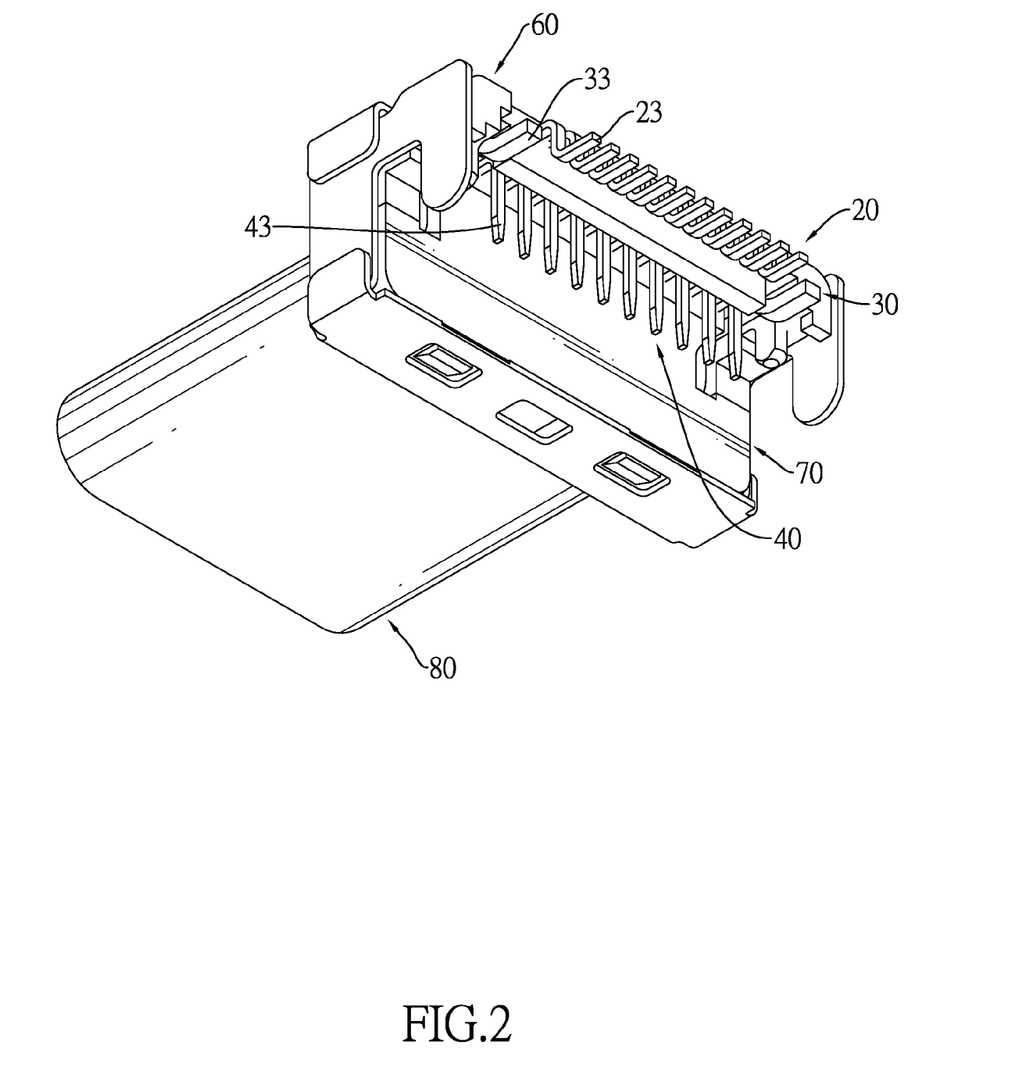
FIG. 2 is a perspective view of the electrical plug connector assembly in FIG. 1 without a circuit board.

With reference to FIGS. 1 and 2, a first embodiment of an electrical plug connector assembly in accordance with the present invention may be a USB Type-C connector, and complies with the USB Type-C Cable and Connector Specification ver. 0.98C set by the USB implementers Forum (USB IF).

Figure 3:
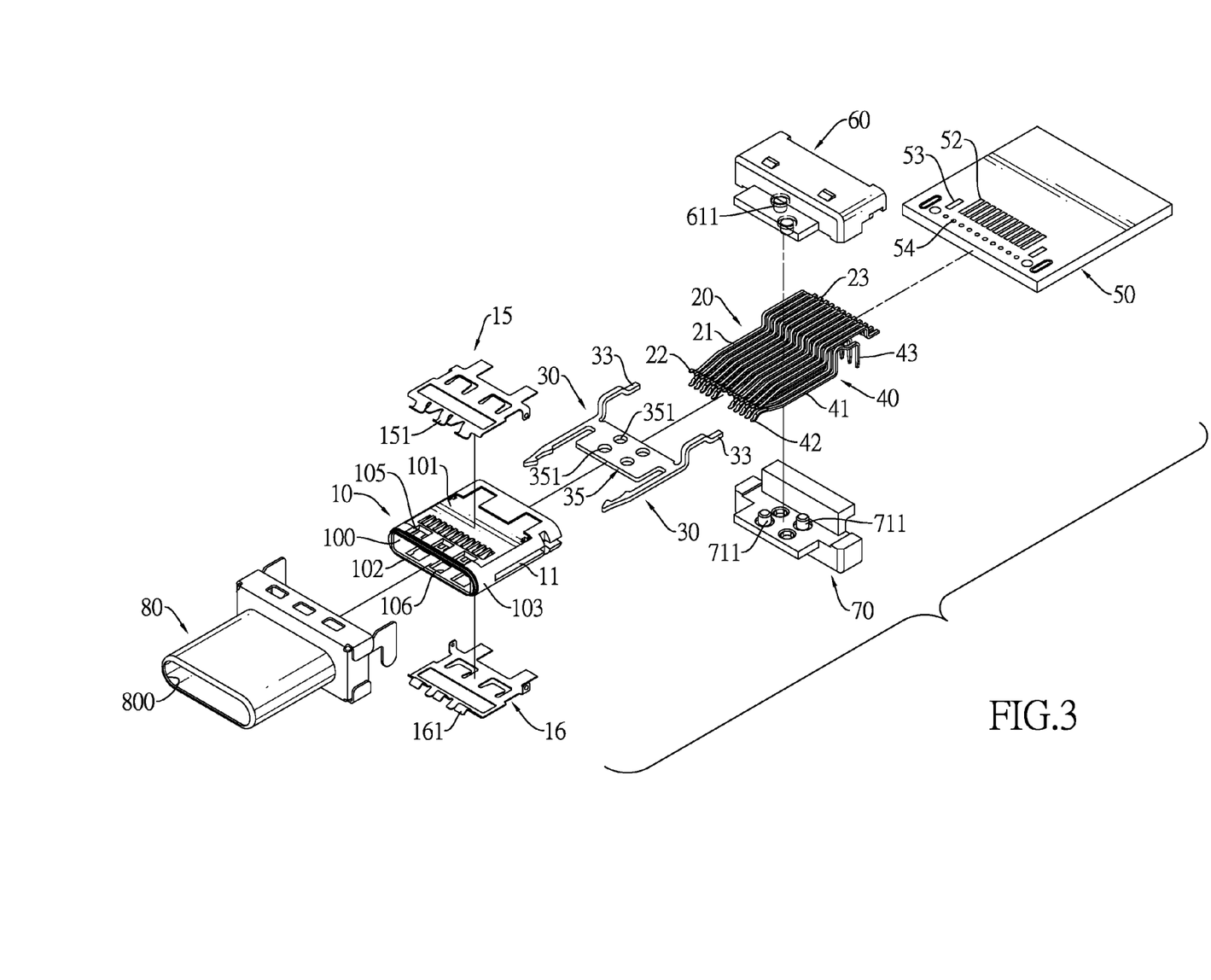
FIG. 3 is an exploded perspective view of the electrical plug connector assembly in FIG. 1.
Figure 4:
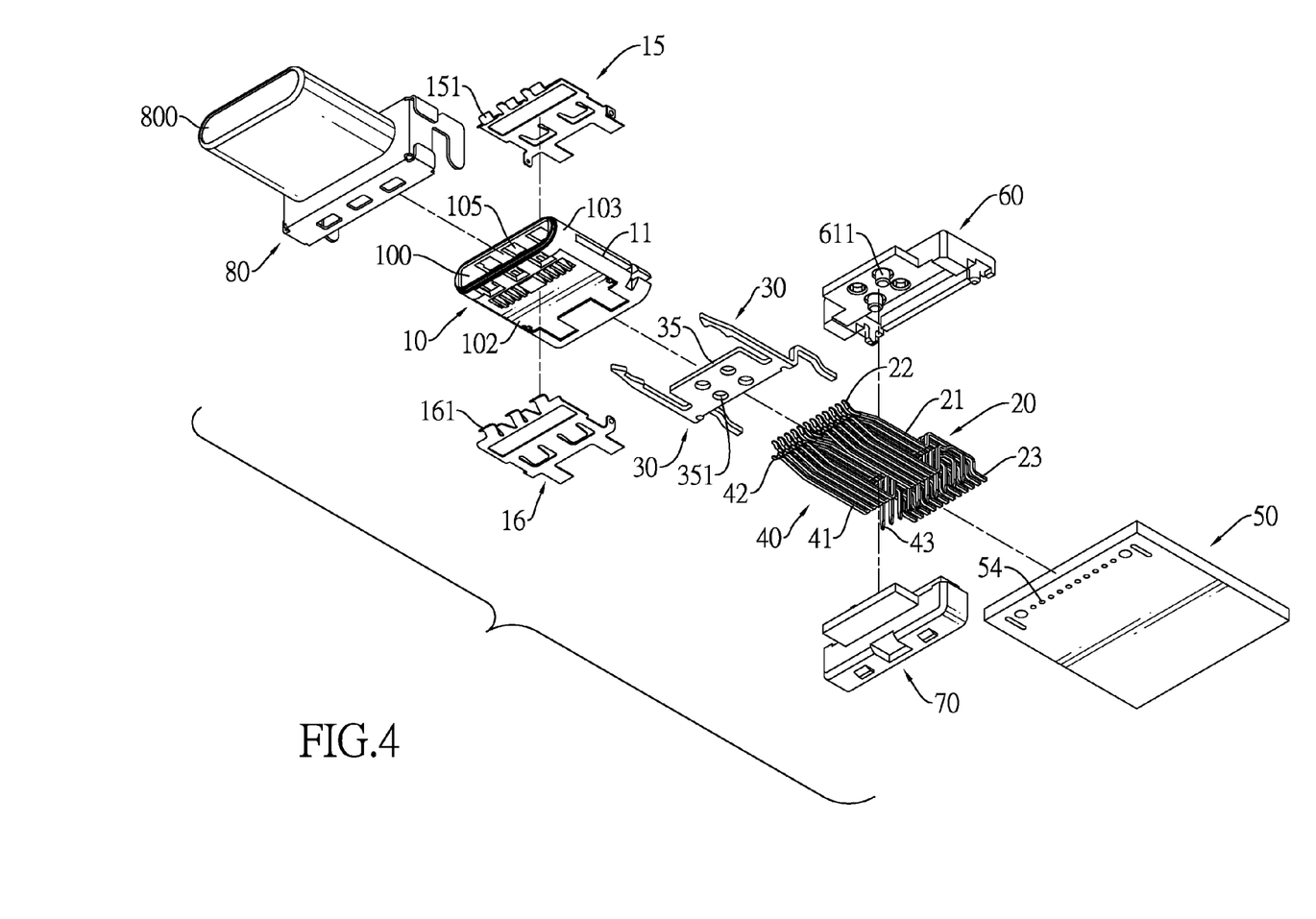
FIG. 4 is another exploded perspective view of the electrical plug connector assembly in FIG. 1.

With further reference to FIGS. 3 and 4, the electrical plug connector assembly comprises an insulative housing 10, a first terminal set, a second terminal set, two resilient hooking arms 30, a grounding plate 35, a circuit board 50, an upper rear plug bracket 60, a lower rear plug bracket 70 and a shell 80.

The insulative housing 10 is substantially horizontally symmetrical and has a top board 101, a bottom board 102, two opposite sidewalls 103, an insertion space 100, an assembling slot 17, two positioning slots 11, an upper pressing element 15 and a lower pressing element 16.

The top board 101 has multiple upper through holes 105. The upper through holes 105 are defined through the top board 101 and communicate with the insertion space 100.

The bottom board 102 has multiple lower through holes 106. The lower through holes 106 are defined through the bottom board 102 and communicate with the insertion space 100.

The sidewalls 103 are located between the top board 101 and the bottom board 102.

The insertion space 100 is defined in a front end of the insulative housing 10 among the top board 101, the bottom board 102 and the sidewalls 103.

The positioning slots 11 are defined through the sidewalls 103 and communicate with the insertion space 100.

The upper pressing element 15 is mounted on the top board 101 and has multiple upper resilient pressing tabs 151 formed on the upper pressing element 15 and respectively extending through the upper through holes 105 into the insertion space 100.

The lower pressing element 16 is mounted on the bottom board 102 and has multiple lower resilient pressing tabs 162 formed on the lower pressing element 16 and respectively extending through the lower through holes 106 into the insertion space 100.

The first and second terminal sets are substantially point symmetrical to each other according to a centre of symmetry of the insertion space 100. According to the point symmetrical configuration of the first and second terminal sets, when the first and second terminal sets are rotated for 180 degrees according to the centre of symmetry, the rotated terminal sets coincide and are identical with the first and second terminal sets without rotation of 180 degrees. By the point symmetrical configuration of the first and second terminal sets, the electrical plug connector assembly is able to extend reversely into a corresponding receptacle connector to normally implement high speed signal transmission. The first and second terminal sets are mounted respectively on the upper inner surface of the top board 101 and the lower inner surface of the bottom board 102.

The first terminal set has multiple first conductive terminals 20 mounted in the top board 101 of the insulative housing 10. Each first conductive terminal 20 has a first mounting section 21, a first electrical contacting section 22 and a first soldering section 23. The first mounting section 21 is mounted on the top board 101 of the insulative housing 10. The first electrical contacting section 22 is formed on and protrudes forward from the first mounting section 21 and extends in the insertion space 100. The first soldering section 23 is formed on and protrudes backward from the first mounting section 21.

The second terminal set has multiple second conductive terminals 40 mounted in the bottom board 102 of the insulative housing 10. Each second conductive terminal 40 has a second mounting section 41, a second electrical contacting section 42 and a second soldering section 43. The second mounting section 41 is mounted on the bottom board 102 of the insulative housing 10. The second electrical contacting section 42 is formed on and protrudes forward from the second mounting section 41 and extends in the insertion space 100. The second soldering section 43 is formed on and protrudes backward from the second mounting section 41.

A number of the second conductive terminals 40 is less than a number of the first conductive terminals 20. The first soldering sections 23 are arranged at identical first soldering intervals. The second soldering sections 43 are arranged at identical second soldering intervals. The second soldering interval is larger than the first soldering interval.

In particular, the number of the second conductive terminals 40 is two pieces less than that of the first conductive terminals 20. The first electrical contacting sections 22 are arranged at identical first contacting intervals. The second electrical contacting sections 22 are divided into two groups at an intermediate interval. The second electrical contacting sections 22 of each group are arranged at identical second contacting intervals. The intermediate interval is larger than the second contacting interval. The second contacting interval is larger than the first contacting interval.

Furthermore, the first or the second terminal set may be mounted in the top board 101 or the bottom board 102 of the insulative housing 10 by an insert-molding process or other assembling process.

A terminal definition chart of the first conductive terminals 20 and second conductive terminals 40 is shown as follows.

| No. | 1 | 2 | 3 | 4 | 5 | 6 | 7 | 8 | 9 | 10 | 11 | 12 |
|---|---|---|---|---|---|---|---|---|---|---|---|---|
| First Terminal Set | GND | RX2+ | RX2− | VBUS | RFU | D− | D+ | CC1 | VBUS | TX1− | TX1+ | GND |
| Second Terminal Set | GND | TX2+ | TX2− | VBUS | CC2 | D+ (Omitted) | D− (Omitted) | RFU | VBUS | RX1− | RX1+ | GND |

According to the aforementioned terminal definition chart, the first or second conductive terminals 20, 40 are numbered from No. 1 to 12. The centre of point symmetric is located among the No. 6 and 7 conductive terminals. Although the second terminal set omits the No. 6 and 7 conductive terminals when compared to the first terminal set, the electrical plug connector assembly is able to implement all functions of signal transmission and power supply in the condition of normal engagement or reverse engagement with a corresponding receptacle connector based on the point symmetry arrangement of the first and second terminal sets.

The resilient hooking arms 30 are mounted in the insulative housing 10, are mounted respectively in the positioning slots 11 and extend in the insertion space 100. Each resilient hooking arm 30 has a grounding soldering leg 33 formed on and protruding backward from the resilient hooking arm 30.

The grounding plate 35 is formed between and connected to the resilient hooking arms 30, is mounted in the rear end of the insulative housing 10, is located between the first terminal set and the second terminal set and has multiple mounting holes 351 defined through the grounding plate 35.

Figure 5:
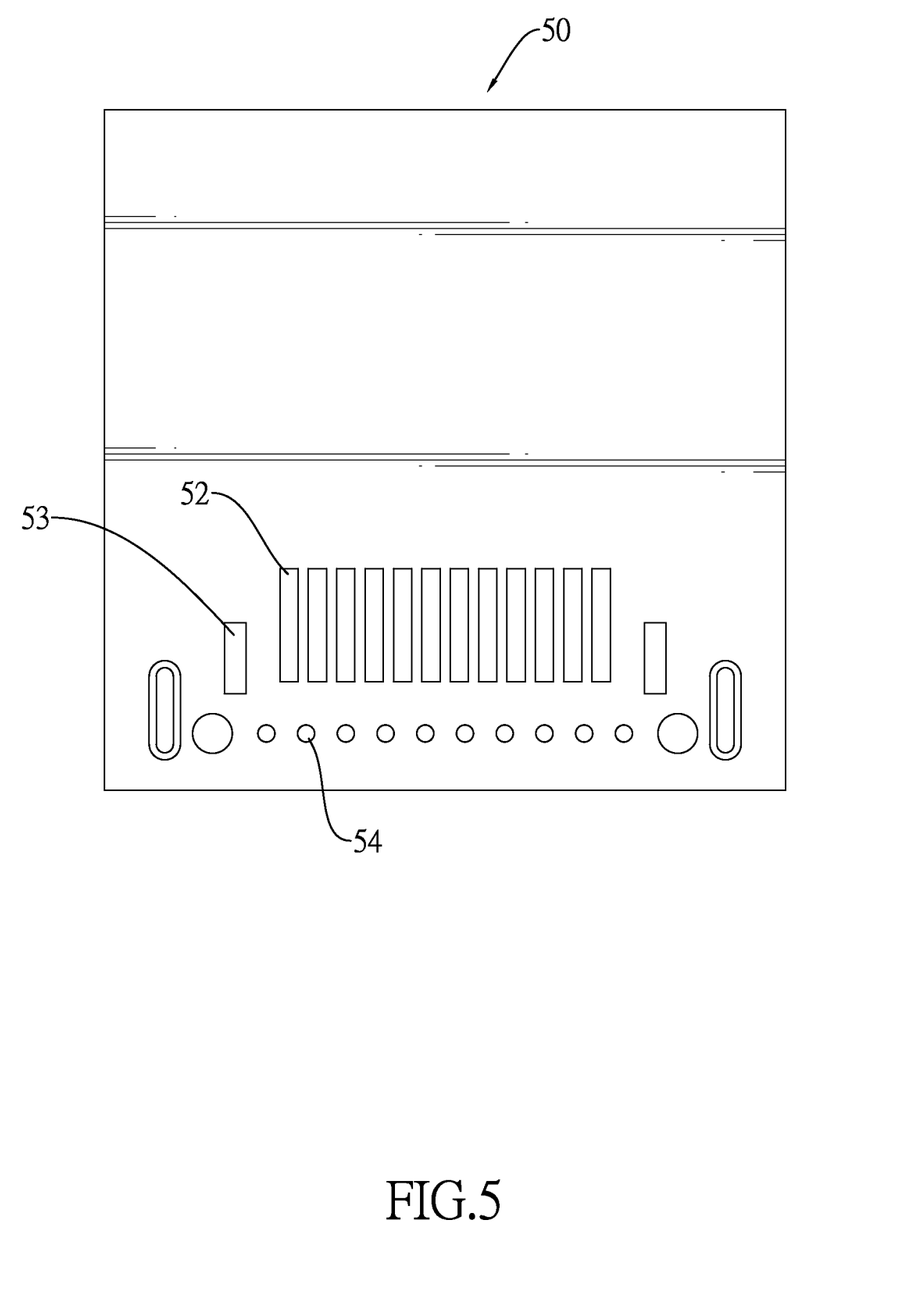
FIG. 5 is a top view of the circuit board of the electrical plug connector assembly in FIG. 1.

With further reference to FIG. 5, the circuit board 50 is connected to the first terminal set and the second terminal set and has multiple first soldering portions 52, multiple second soldering portions 54 and two third soldering portions 53.

The first soldering portions 52 are mounted on the circuit board 50 at identical first portion intervals and are soldered respectively with the first soldering sections 23 of the first conductive terminals 20.

The second soldering portions 54 are mounted on the circuit board 50 at identical second portion intervals and are soldered respectively with the second soldering sections 43 of the second conductive terminals 40.

The first soldering sections 23 of the first conductive terminals 20 and the second soldering sections 43 of the second conductive terminals 40 are soldered on an identical surface of the circuit board 50. For example, the first soldering sections 23 and the second soldering sections 43 are soldered on a top surface of the circuit board 50. Therefore, only a single soldering process is required to simultaneously solder all of the first soldering sections 23 and the second soldering sections 43 on the circuit board 50.

Furthermore, a number of the second soldering portions 54 are less than a number of the first soldering portions 52. The second portion interval is larger than the first portion interval.

The third soldering portions 53 are formed on the top surface of the circuit board 50 and are soldered respectively with the grounding soldering legs 33.

Figure 9:
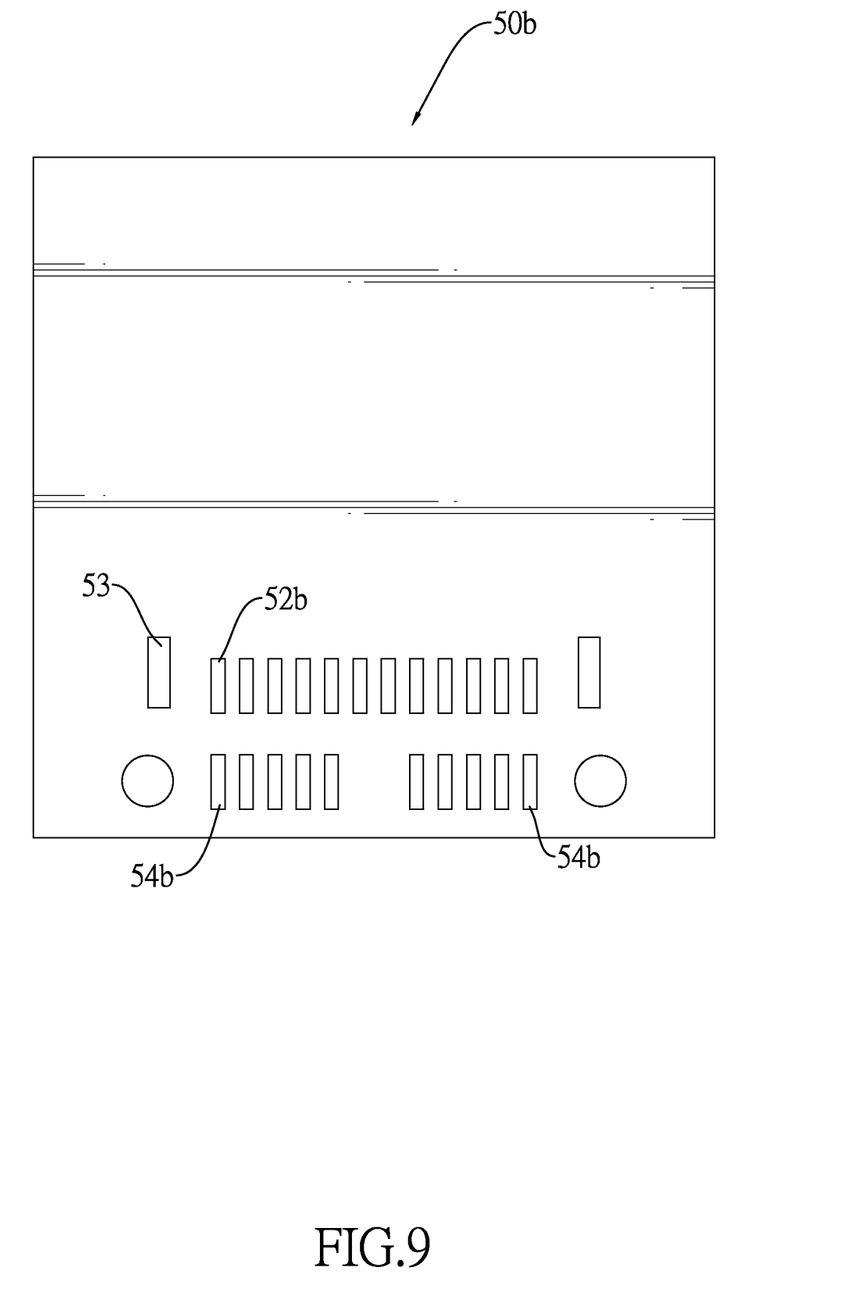
FIG. 9 is a top view of a circuit board of the electrical plug connector assembly in FIG. 8.

With further reference to FIG. 9, the upper rear plug bracket 60 is mounted on the rear end of the insulative housing 10, is mounted above the grounding plate 35 and has multiple upper mounting protrusions 611.

The upper mounting protrusions 611 are formed on and protrude downward from the upper rear plug bracket 60 and are mounted in a part of the mounting holes 351 of the grounding plate 35.

The lower rear plug bracket 70 is mounted on the rear end of the insulative housing 10, is mounted under the grounding plate 35 and has multiple lower mounting protrusions 711.

The lower mounting protrusions 711 are formed on and protrude upward from the lower rear plug bracket 70 and are mounted respectively in another part of the mounting holes 351 of the grounding plate 35.

The shell 80 is made of metal, is substantially horizontally symmetrical and has a cavity 800 defined in the shell 80 and accommodating the insulative housing 10, the first terminal set and the second terminal set.

In the first embodiment of the electrical plug connector in accordance with the present invention, the first soldering sections 23 of the first conductive terminals 20 are Surface Mount Technology (SMT) type soldering legs, and the second soldering sections 43 of the second conductive terminals 40 are Dual In-line Package (DIP) type soldering legs. The first soldering portions 52 of the circuit board 50 are SMT type soldering pads. The second soldering portions 54 are DIP type through holes that are arranged in a row.

Figure 6:
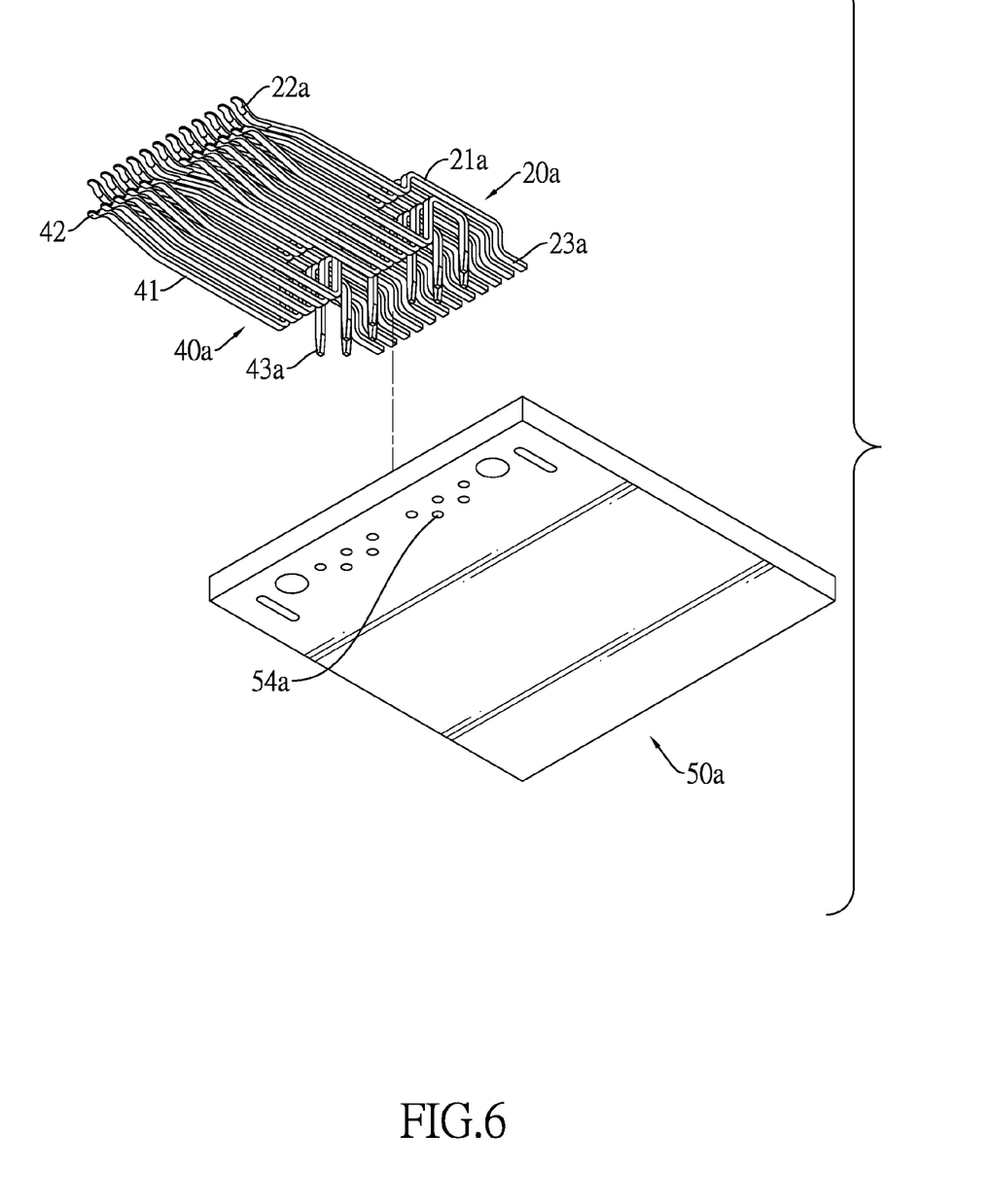
FIG. 6 an exploded perspective view of a circuit board and terminals of a second embodiment of the electrical plug connector assembly in accordance with the present invention.
Figure 7:
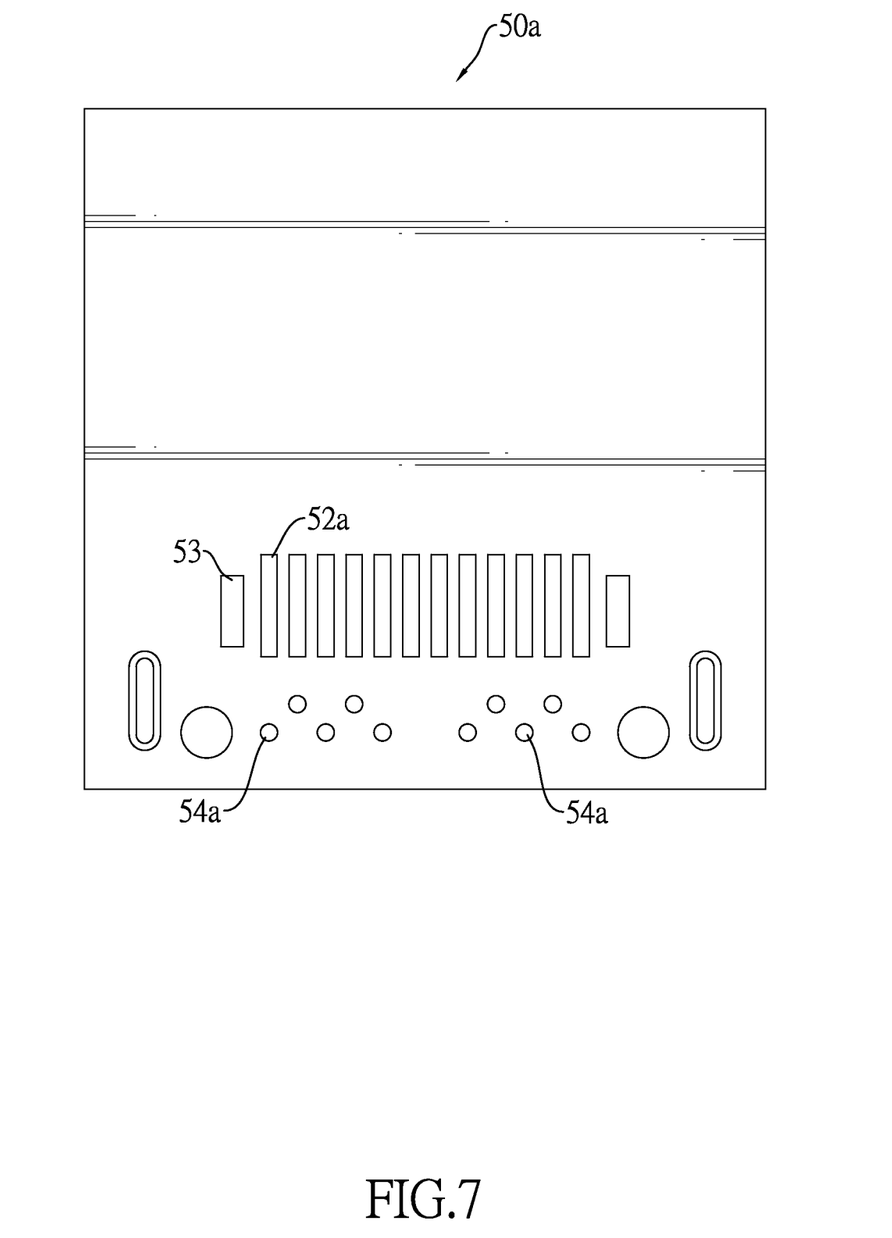
FIG. 7 is a top view of two sets of terminals of the electrical plug connector assembly in FIG. 6.

With further reference to FIGS. 6 and 7, in a second embodiment of the electric plug connector in accordance with the present invention, the first soldering sections 23a of the first conductive terminals 20 are SMT type soldering legs, and the second soldering sections 43a of the second conductive terminals 40 are DIP type soldering legs. The first soldering portions 52a of the circuit board 50a are SMT type soldering pads. The second soldering portions 54a are DIP type through holes that are staggeredly arranged.

Figure 8:
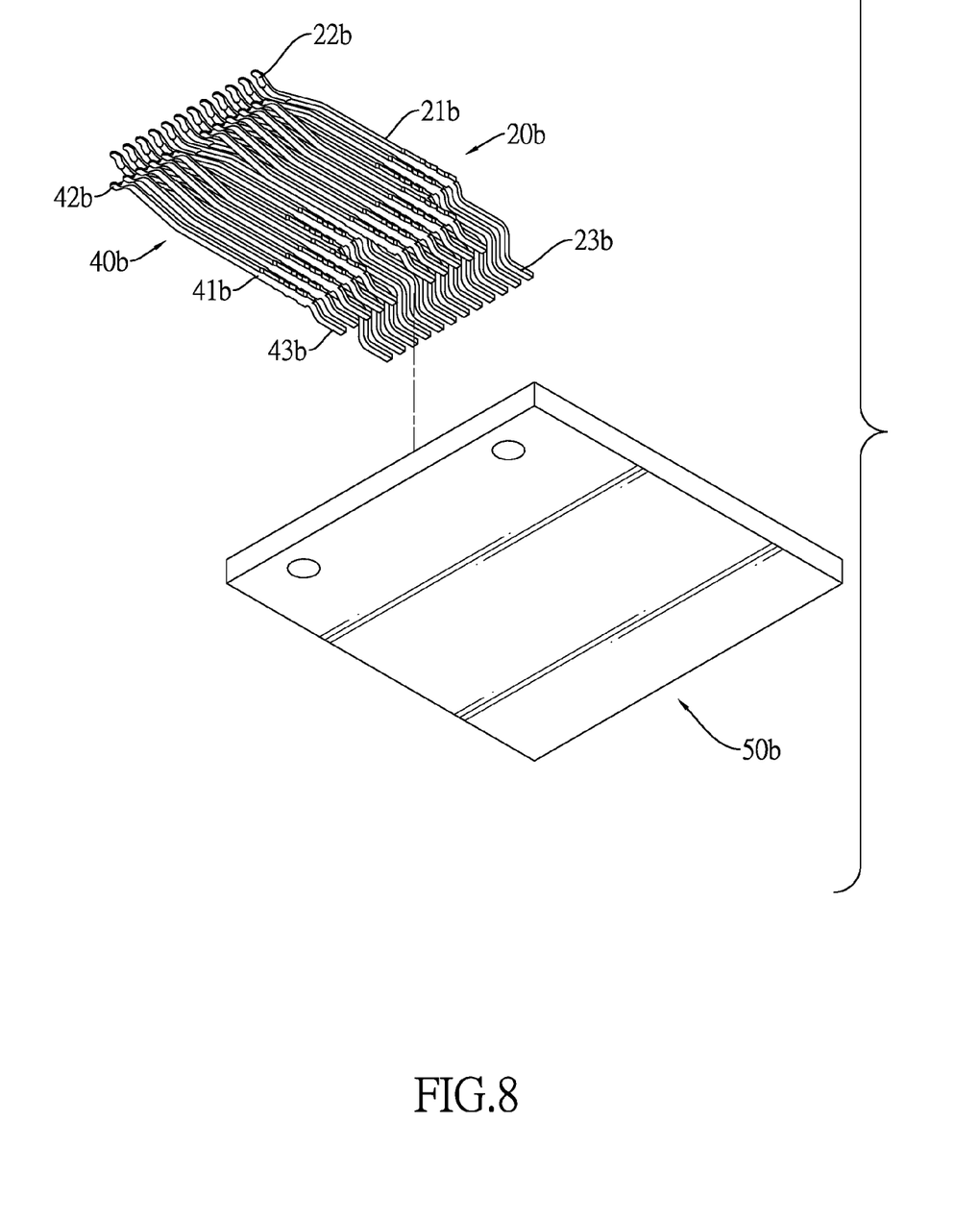
FIG. 8 is an exploded perspective view of a circuit board and terminals of a third embodiment of the electrical plug connector assembly in accordance with the present invention.

With further reference to FIGS. 8 and 9, in a third embodiment of the electric plug connector in accordance with the present invention, the first soldering sections 23b of the first conductive terminals 20 are SMT type soldering legs, and the second soldering sections 43b of the second conductive terminals 40 are SMT type soldering legs. The first soldering portions 52b of the circuit board 50b are SMT type soldering pads. The second soldering portions 54b are SMT type soldering pads.

Figure 10:
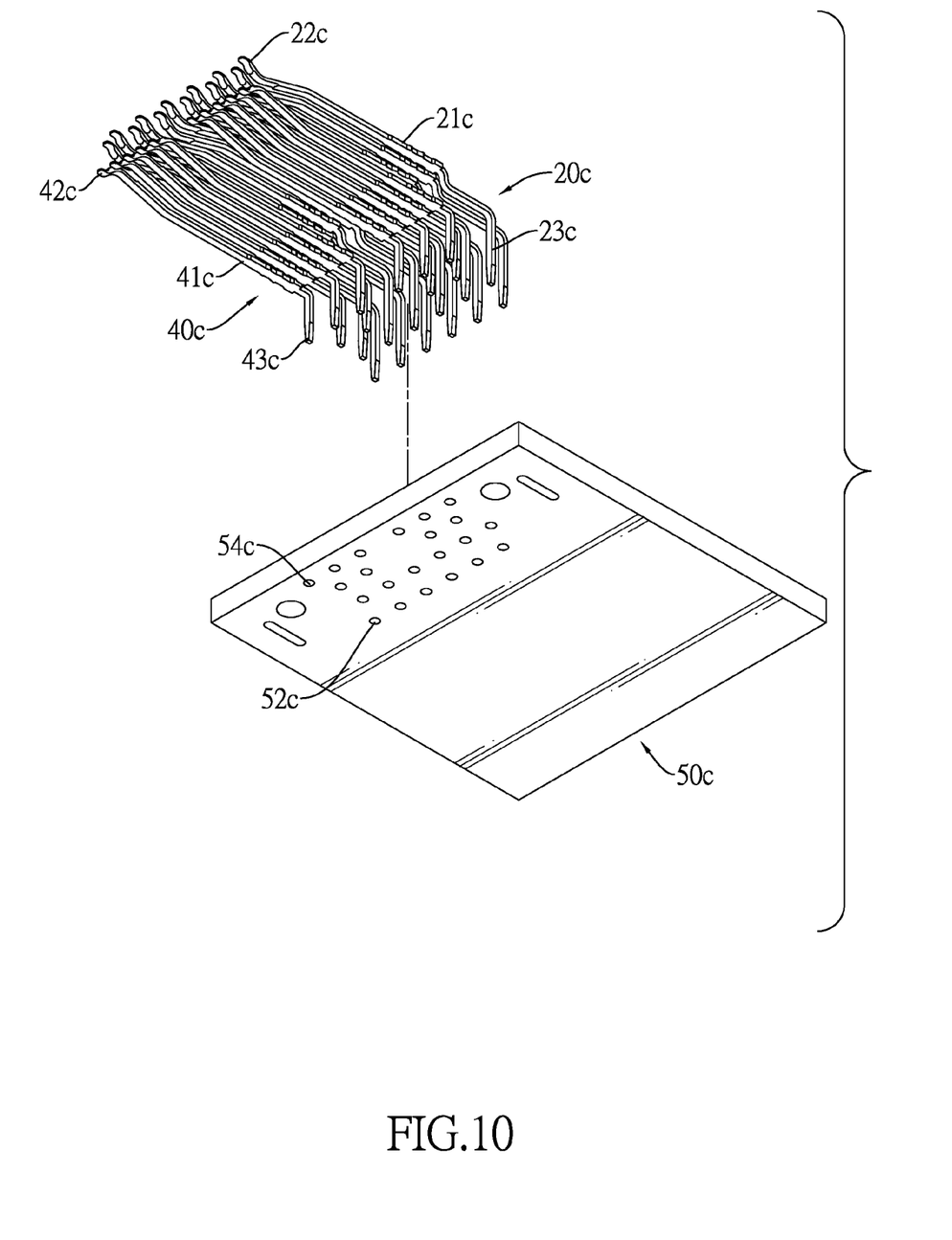
FIG. 10 is an exploded perspective view of a fourth embodiment of the electrical plug connector assembly in accordance with the present invention.
Figure 11:
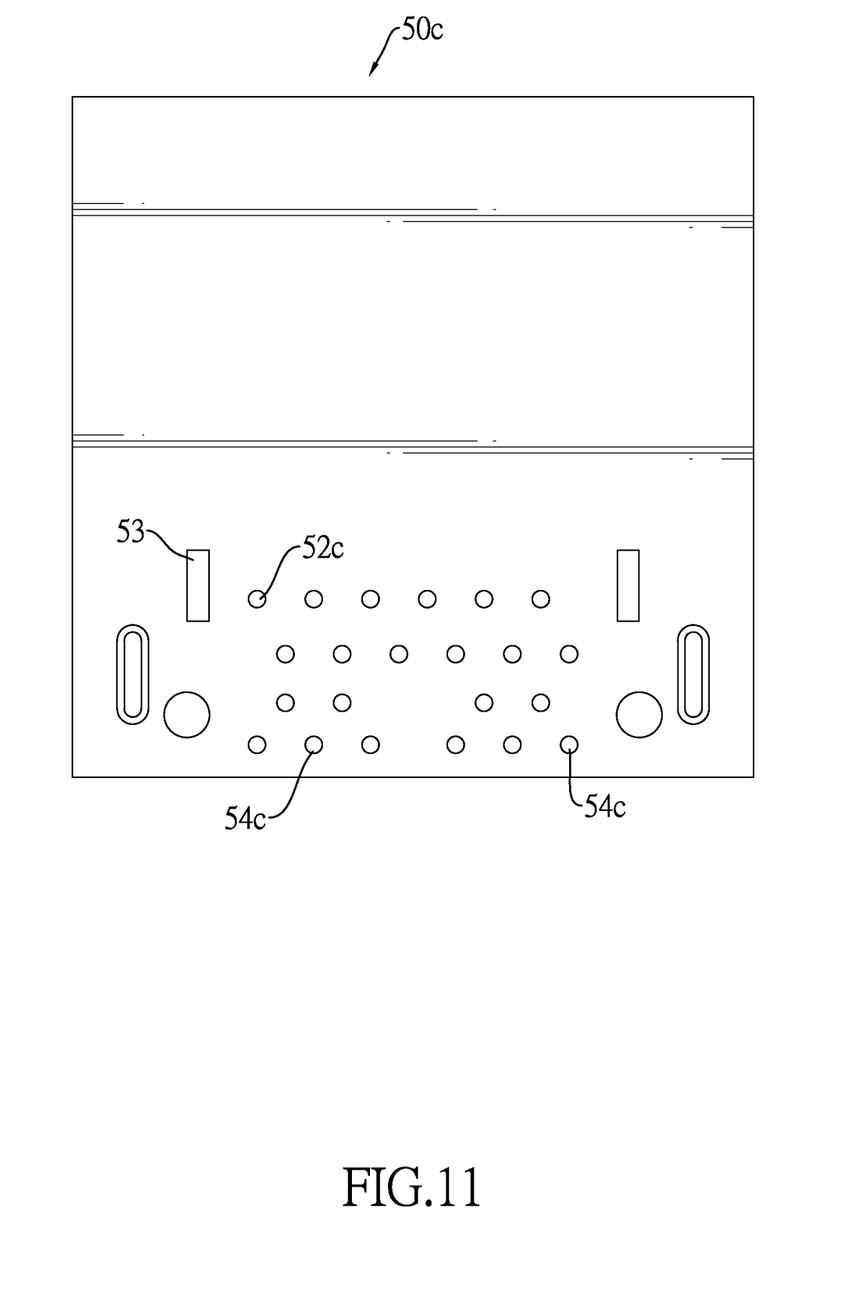
FIG. 11 is a top view of a circuit board of the electrical plug connector assembly in FIG. 10.

With further reference to FIGS. 10 and 11, in a fourth embodiment of the electric plug connector in accordance with the present invention, the first soldering sections 23c of the first conductive terminals 20 are DIP type soldering legs, and the second soldering sections 43c of the second conductive terminals 40 are DIP type soldering legs. The first soldering portions 52c of the circuit board 50c are DIP type through holes that are staggeredly arranged. The second soldering portions 54c are DIP type through holes that are staggeredly arranged.

Furthermore, the number of the second conductive terminals 40c is less than that of the first conductive terminals 20c as shown in FIGS. 10 and 11. The fourth embodiment can be further modified to a fifth embodiment with equal quantities of the first conductive terminals 20c and second conductive terminals 40c and equal quantities of the first soldering portions 52c and the second soldering portions 54c on the circuit board 50c.

The electrical plug connector assembly has the following advantages.

1. The first soldering sections 23 and the second soldering sections 43 are simultaneously mounted on the identical surface of the circuit board 50 such that only one single soldering process is required to solder all of the first and second conductive terminals 20, 40 to the circuit board 50. The production rate of the electrical plug connector assembly is therefore improved.

2. The number of the second conductive terminals 40 of the second terminal set is less than the number of the first conductive terminals 20 of the first terminal set, and the number of the second soldering sections 43 is less than the number of the first soldering sections 23. Therefore, the second soldering sections 43 are arranged more loosely when compared to the arrangement of the first soldering sections 23, and the second soldering interval is larger than the first soldering interval. Furthermore, the number of the second soldering portions 54 on the circuit board 50 is less than that of the first soldering portions 52 such that the second portion interval is larger than the first portion interval. The loose arrangement of the second soldering sections 43 and the second soldering portions 54 allows solder to be imprecisely attached between the second terminal set and the circuit board 50. The use of the solder is given with higher tolerance. Therefore, false soldering and solder skip due to insufficient solder and short circuit due to the excessive solder can be avoided.

3. The upper rear plug bracket 60 and the lower rear plug bracket 70 are mounted simultaneously on the insulative housing 10 and the grounding plate 35, which improves the structural strength of the electrical plug connector assembly.

4. The electrical plug connector assembly complies with the USB Type-C standard and has the horizontally symmetrical insulative housing 10, the horizontally symmetrical shell 80 and the point symmetrical terminal sets based on the centre of symmetry of the insertion space 100. Therefore, the electrical plug connector assembly is able to be normally or reversely engaged with the corresponding receptacle connector without any additional foolproof structures.

Even though numerous characteristics and advantages of the present invention have been set forth in the foregoing description, together with details of the structure and function of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:
1. An electrical plug connector assembly comprising:
   an insulative housing having a top board, a bottom board, two opposite sidewalls and an insertion space defined in a front end of the insulative housing among the top board, the bottom board and the sidewalls;

a first terminal set and a second terminal set being substantially point symmetrical to each other according to a centre of symmetry of the insertion space, and mounted respectively on an upper inner surface of the top board and a lower inner surface of the bottom board;

the first terminal set having multiple first conductive terminals mounted in the top board and each first conductive terminal having
   a first mounting section mounted on the top board of the insulative housing;
   a first electrical contacting section formed on and protruding forward from the first mounting section and extending in the insertion space; and
   a first soldering section formed on and protruding backward from the first mounting section;

the second terminal set having multiple second conductive terminals mounted in the bottom board and each second conductive terminal having
   a second mounting section mounted on the bottom board of the insulative housing;
   a second electrical contacting section formed on and protruding forward from the second mounting section and extending in the insertion space; and
   a second soldering section formed on and protruding backward from the second mounting section;

a circuit board connected to the first terminal set and the second terminal set and having
   multiple first soldering portions mounted on the circuit board at identical first portion intervals and soldered respectively with the first soldering sections of the first conductive terminals; and
   multiple second soldering portions mounted on the circuit board at identical second portion intervals and soldered respectively with the second soldering sections of the second conductive terminals, wherein the first soldering sections of the first conductive terminals and the second soldering sections of the second conductive terminals are soldered on an identical surface of the circuit board; and a shell having a cavity defined in the shell and accommodating the insulative housing, the first terminal set and the second terminal set.

2. The electrical plug connector assembly as claimed in claim 1, wherein
   a number of the second conductive terminals is less than a number of the first conductive terminals;
   the first soldering sections are arranged at identical first soldering intervals;
   the second soldering sections are arranged at identical second soldering intervals; and
   the second soldering interval is larger than the first soldering interval.

3. The electrical plug connector assembly as claimed in claim 2, wherein
   the first soldering sections of the first conductive terminals are DIP type soldering legs, and the second soldering sections of the second conductive terminals are DIP type soldering legs; and
   the first soldering portions of the circuit board are DIP type through holes that are staggeredly arranged, and the second soldering portions are DIP type through holes that are staggeredly arranged.

4. The electrical plug connector assembly as claimed in claim 3, wherein two resilient hooking arms are mounted in the insulative housing and extend in the insertion space.

5. The electrical plug connector assembly as claimed in claim 4, wherein a grounding plate is formed between and connected to the resilient hooking arms, is mounted in a rear end of the insulative housing, and is located between the first terminal set and the second terminal set.

6. The electrical plug connector assembly as claimed in claim 5, wherein each resilient hooking arm has a grounding soldering leg formed on and protruding backward from the resilient hooking arm.

7. The electrical plug connector assembly as claimed in claim 4, wherein
   the number of the second conductive terminals is two pieces less than the number of the first conductive terminals;
   the first electrical contacting sections are arranged at identical first contacting intervals;
   the second electrical contacting sections are divided into two groups at an intermediate interval, and the second electrical contacting sections of each group are arranged at identical second contacting intervals;
   the intermediate interval is larger than the second contacting interval, and the second contacting interval is larger than the first contacting interval.

8. The electrical plug connector assembly as claimed in claim 1, wherein
   the first soldering sections of the first conductive terminals are Surface Mount Technology (SMT) type soldering legs, and the second soldering sections of the second conductive terminals are Double in-line Package (DIP) type soldering legs; and
   the first soldering portions of the circuit board are SMT type soldering pads, and the second soldering portions are DIP type through holes that are arranged in a row.

9. The electrical plug connector assembly as claimed in claim 1, wherein
   the first soldering sections of the first conductive terminals are SMT type soldering legs, and the second soldering sections of the second conductive terminals are DIP type soldering legs; and
   the first soldering portions of the circuit board are SMT type soldering pads, and the second soldering portions are DIP type through holes that are staggeredly arranged.

10. The electrical plug connector assembly as claimed in claim 1, wherein
   the first soldering sections of the first conductive terminals are SMT type soldering legs, and the second soldering sections of the second conductive terminals are SMT type soldering legs; and
   the first soldering portions of the circuit board are SMT type soldering pads, and the second soldering portions are SMT type soldering pads.

11. The electrical plug connector assembly as claimed in claim 10, wherein
   two positioning slots are defined through the sidewalls and communicate with the insertion space; and
   the resilient hooking arms are mounted respectively in the positioning slots.

12. The electrical plug connector assembly as claimed in claim 11, wherein
   the grounding plate has multiple mounting holes defined through the grounding plate;
   an upper rear plug bracket is mounted on the rear end of the insulative housing, is mounted above the grounding plate and has multiple upper mounting protrusions formed on and protruding downward from the upper rear plug bracket and mounted in a part of the mounting holes of the grounding plate;

a lower rear plug bracket is mounted on the rear end of the insulative housing, is mounted under the grounding plate and has multiple lower mounting protrusions formed on and protruding upward from the lower rear plug bracket and is mounted in another part of the mounting holes of the grounding plate.

13. The electrical plug connector assembly as claimed in claim 1, wherein
the first soldering sections of the first conductive terminals are DIP type soldering legs, and the second soldering sections of the second conductive terminals are DIP type soldering legs;
the first soldering portions of the circuit board are DIP type through holes that are staggeredly arranged, and the second soldering portions are DIP type through holes that are staggeredly arranged; and
a quantity of the first conductive terminals and a quantity of the second conductive terminals are equal, and a quantity of the first soldering portions and a quantity of the second soldering portions are equal.

14. The electrical plug connector assembly as claimed in claim 1, wherein
the top board has multiple upper through holes defined through the top board and communicating with the insertion space;
the bottom board has multiple lower through holes defined through the bottom board and communicating with the insertion space;
an upper pressing element is mounted on the top board and has multiple upper resilient pressing tabs formed on the upper pressing element and respectively extending through the upper through holes into the insertion space; and
a lower pressing element is mounted on the bottom board and has multiple lower resilient pressing tabs formed on the lower pressing element and respectively extending through the lower through holes into the insertion space.

\* \* \* \* \*